United States Patent [19]

Kato et al.

[11] 4,413,703

[45] Nov. 8, 1983

[54] BASS-REFLEX TYPE SPEAKER SYSTEM

[75] Inventors: Harumitsu Kato, Hachioji; Hironori Yamada, Hidaka; Kaoru Yamazaki, Akigawa; Masashi Maruyama, Iruma; Takashi Ogasawara, Seki, all of Japan

[73] Assignee: Trio Kabushiki Kaisha, Tokyo, Japan

[21] Appl. No.: 357,654

[22] Filed: Mar. 12, 1982

[30] Foreign Application Priority Data

Mar. 16, 1981 [JP] Japan ............................... 56-37443

[51] Int. Cl.$^{3}$ ............................................ H05K 5/00

[52] U.S. Cl. .................................... 181/156; 181/199

[58] Field of Search ............... 181/155, 156, 199, 144, 181/148

[56] References Cited

U.S. PATENT DOCUMENTS

| | | | |
|---|---|---|---|
| 2,757,751 | 8/1956 | Tavaoes | 181/31 |
| 3,952,159 | 4/1976 | Schokk | 181/156 X |
| 4,196,792 | 4/1980 | Grieves | 181/199 X |
| 4,200,170 | 4/1980 | Williams, Jr. | 181/155 |

*Primary Examiner*—Benjamin R. Fuller
*Attorney, Agent, or Firm*—Gerald J. Ferguson, Jr.; Joseph J. Baker

[57] ABSTRACT

A bass-reflex type speaker system having a cabinet including a front baffle board, a back panel and two side panels and a speaker mounted on the front panel. A port is disposed in either the back panel or in one of the side panels and a duct is in communication with the port. The back panel may be flat or have a generally triangular cross-sectional configuration where the apex of the triangle is directed toward the speaker. Further, the speaker may be positioned in the approximate center of the front baffle board and the port positioned at the apex of the back panel. A beam may be provided extending across and spaced from the port, the beam having a triangular shaped tip directed toward and spaced from the port.

6 Claims, 5 Drawing Figures

BASS-REFLEX TYPE SPEAKER SYSTEM

BACKGROUND OF THE INVENTION

1. Field of the Invention

This invention relates to a bass-reflex type speaker system.

2. Discussion of the Prior Art

Conventionally, ducts and ports in bass-reflex type speaker systems are installed on the front baffle board. However, the sound produced from such ducts and ports is not clear. Therefore, various means have been employed in the past to solve this problem. However, due to the fact that all of these means employ ducts and ports on the front baffle board, the sound released from the speaker cone is modulated such that unsatisfactory results are obtained.

SUMMARY OF THE INVENTION

As a result of various studies and experiments by the inventors, a duct and port serving also as an air vent were positioned on the back panel of the cabinet in order to obtain smooth movement of the vibration system of the speaker unit, especially the woofer. It was discovered this position reduced the load of the vibration system and effected a reproduction of the bass range which could not be obtained in a closed type system. At the same time, the sound from the speaker cone was separated from the sound from the duct and port which resulted in reproduction with a favorable S/N ratio. Although it is preferable to position the duct and port on the back panel, it was determined they can also be installed on one of the side panels.

OBJECTS OF THE INVENTION

A primary object of this invention is to provide a bass-reflex type speaker system in which the load of the vibration system of the speaker unit can be reduced while, at the same time, the sound from the duct and port can be appropriately separated from that produced by the cone of the speaker unit without modulating the latter sound.

Other objects and advantages of this invention will be apparent from a reading of the following specification and claims taken with the drawing.

DETAILED DESCRIPTION OF PREFERRED AND OTHER EMBODIMENTS OF THE INVENTION

Figure 1:
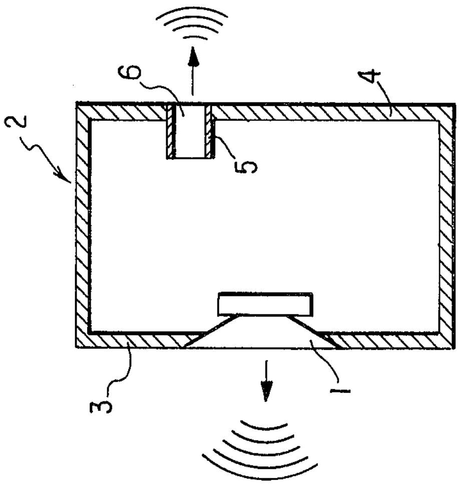
FIG. 1 is a cross-sectional view of an illustrative embodiment of a bass-reflex type speaker system in accordance with the present invention.

In the various figures of the drawing, 1 is a speaker unit such as a woofer, 2 indicates the cabinet as a whole, 3 is a baffle board, and 4 is the back panel.

In FIG. 1, duct 5 and port 6 are installed on the back panel. They are positioned slightly higher than the position directly behind speaker unit 1. Although it is preferable to install the duct 5 and port 6 on the back panel, a considerable effect can also be obtained even when they are positioned on a side panel.

Figure 5:
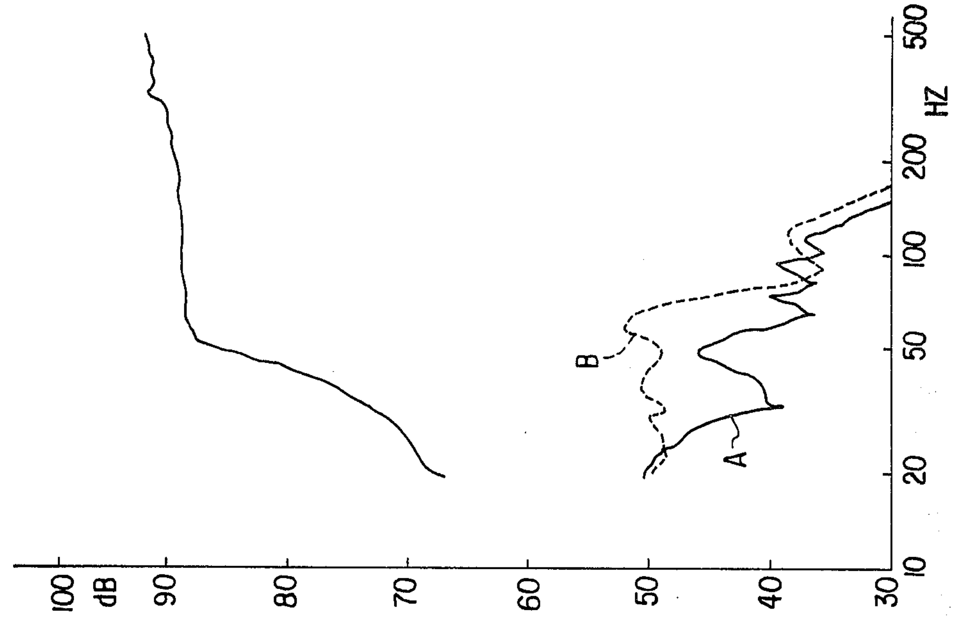
FIG. 5 is a graph which illustrates and compares the respective characteristics of the FIG. 1 embodiment and the conventional bass-reflex type speaker system.

FIG. 5 is a characteristics graph for evaluating the third harmonic distortions of the unit of FIG. 1 where A indicates the results of the present invention and B those of a conventional bass-reflex speaker unit.

Figure 2:
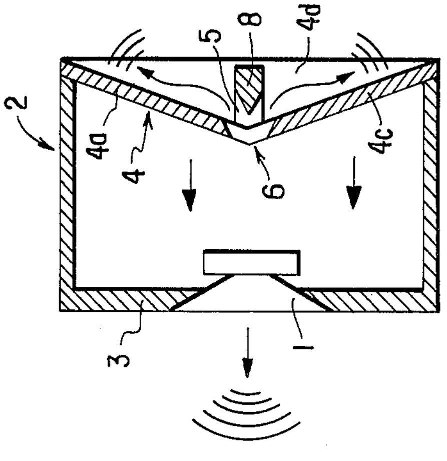
FIG. 2 is a cross-sectional view of another illustrative embodiment of the invention.
Figure 3:
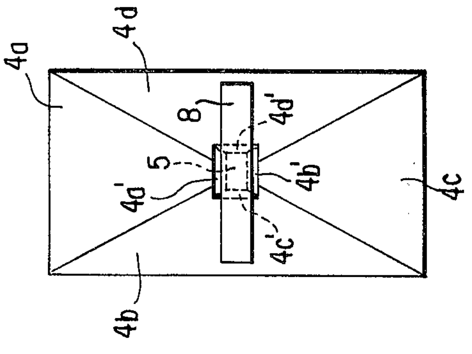
FIG. 3 is a rear elevation view of the FIG. 2 embodiment.
Figure 4:
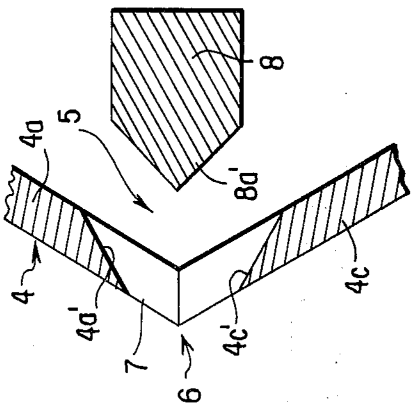
FIG. 4 is an enlarged cross-sectional view of the duct and port structural area of the FIG. 2 embodiment.

In the system shown in FIGS. 2–4, back panel 4 comprises four triangular boards 4*a*, 4*b*, 4*c*, and 4*d* which abut to form an angular configuration having its apex directed toward the inside of the cabinet—that is, in the direction of the speaker unit. Duct 5 and port 6 are constructed as follows. A rectangular hole 7 is made at the above-mentioned apex where the opening of the rectangular hole is gradually enlarged from the inside of the cabinet to the outside thereof by cutting back panel 4 at an angle to the thickness of boards 4*a*–4*d* to thereby form sides 4*a*', 4*b*', 4*c*', and 4*d*'. Outside rectangular hole 7, a diffuser 8 having a forward tip 8*a*' formed in a triangular shape is positioned a predetermined distance from the hole. Diffuser 8 was made in this embodiment by cutting the inner side of a reinforcing beam crossing over boards 4*b* and 4*d* in a triangular shape. However, a separate piece with a triangular-shaped tip may be attached onto the reinforcing beam.

It is preferred duct 5 and port 6 in the FIG. 2 embodiment be positioned directly behind the speaker unit (woofer) 1 so that the back pressure of the woofer will be directly released. Consequently, when the speaker unit is placed in a position off the center of the the baffle board, the above-mentioned duct and port are positioned accordingly. In this manner, the air is well vented during the breathing time of the speaker, the energy in the cabinet is reduced, and less standing waves are generated.

The effectiveness of the FIG. 2 embodiment is very good. First, the construction itself is strong. Next, even if the sound emanating from the back surface of the speaker hits the back panel, the reflected sound does not return to the emanation point on the baffle board since the back panel is not parallel to the baffle board. Thus, the sound will be dampened while bouncing in the cabinet such that less standing waves are generated. Hence, these waves will be quickly dampened as they are generated.

In addition, when duct 5 and port 6 are installed on a back panel having a pyramidal or conical shape as in FIG. 2, a greater distance can be maintained between a wall (not shown) that may be present behind the back panel. For example, if the back panel is flat with the duct and port simply installed, the wall will act as a resistance to air release even with a distance of 10 cm–20 cm between the hole and the wall. Whereas in the case of the FIG. 2 embodiment, the duct and port are set inward resulting in a greater distance to the wall. Furthermore, the air is diffused upward and downward (or in all directions) by diffuser 8 such that the effect of the wall in the back is reduced, and the difference in sound quality is also lessened.

When the bass-reflex type speaker system of this invention is used, due to the fact that the duct and port are installed on a panel other than the front baffle board, it does not modulate the sound emanating from the cone of the speaker unit. Further, the sounds from the speaker and the port are appropriately separated, thus enabling reproduction with a good S/N ratio. Consequently, the sound from the duct and port becomes clear and the load (back pressure) of the vibration system of the speaker can be reduced thus lessening the generation of standing waves and reproducing a bass range which can not be obtained by a closed type system.

We claim:

1. In a bass-reflex type speaker system having a cabinet including a front baffle board, a back panel and two side panels and a speaker mounted on the front panel, the improvement comprising the back panel having a generally triangular cross-sectional configuration where the apex of the triangle is directed toward the speaker; and a port disposed in said back panel at the apex of the triangle and a duct in communication with said port where the port is positioned directly behind the speaker.

2. The improvement as in claim 1 where the back panel has a pyramidal configuration.

3. The improvement as in claim 1 where the back panel has a conical configuration.

4. The improvement as in claim 1 where the speaker is positioned in the approximate center of the front baffle board and the port is positioned at the said apex.

5. The improvement as in claim 1 including a beam extending across and spaced from said port, said beam having a triangular shaped tip directed toward and spaced from the port.

6. The improvement as in claim 5 where the port flares outwardly from the inside of the cabinet to the outside thereof.

* * * * *